United States Patent [19]

Weaver

[11] Patent Number: 4,802,222

[45] Date of Patent: Jan. 31, 1989

[54] DATA COMPRESSION SYSTEM AND METHOD FOR AUDIO SIGNALS

[75] Inventor: Charles S. Weaver, Palo Alto, Calif.

[73] Assignee: SRI International, Menlo Park, Calif.

[21] Appl. No.: 89,487

[22] Filed: Aug. 25, 1987

Related U.S. Application Data

[63] Continuation-in-part of Ser. No. 560,610, Dec. 12, 1983, abandoned, which is a continuation-in-part of Ser. No. 202,457, Oct. 31, 1980, Pat. No. 4,449,536.

[51] Int. Cl.[4] .................................................. G10L 5/00
[52] U.S. Cl. ...................................... 381/35; 128/696; 364/413.03; 364/724.19; 375/122
[58] Field of Search .................................... 381/29–41; 364/413.06; 364/724.19; 375/122

[56] References Cited

U.S. PATENT DOCUMENTS

| | | | |
|---|---|---|---|
| 3,598,921 | 8/1971 | Paine | 179/15.55 R |
| 4,413,289 | 11/1983 | Weaver et al. | 360/51 |
| 4,449,536 | 5/1984 | Weaver | 128/696 |
| 4,534,055 | 8/1985 | Iinuma | 381/34 |
| 4,546,342 | 10/1985 | Weaver et al. | 340/347 |

FOREIGN PATENT DOCUMENTS

WO85/02529 6/1985 PCT Int'l Appl. .

OTHER PUBLICATIONS

Ruttimann et al., "IEEE Transactions on Biomedical Engineering", vol. BME-26, No. 11, Nov. 1979, pp. 613–623.
Bertrand et al., "Proceedings of the IEEE", vol. 65, No. 5, May 1977, pp. 714–721.
Ripley et al., "A Computer System for Capturing Transient Electrocardiographic Data", Pro. Comput. Cardiol 1976, pp. 439–445.

Primary Examiner—Emanuel S. Kemeny
Attorney, Agent, or Firm—Victor R. Beckman

[57] ABSTRACT

Audio signals such as ECG, speech and music are digitally processed to reduce the bit-rate needed for accurate transmission, known as minimizing the entropy of the signal. The transmitter features a digital compression filter with zeros restricted to certain points on the unit circle, and Huffman encoding for transmission. The receiver features a digital decompression filter with poles at the zero locations, but shifted inside the unit circle to prevent error-ramp build-up.

23 Claims, 9 Drawing Sheets

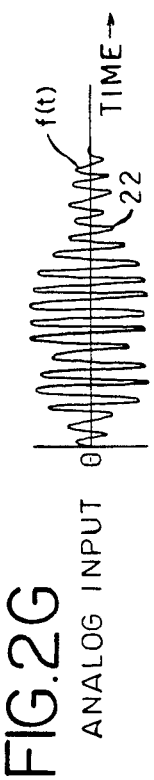
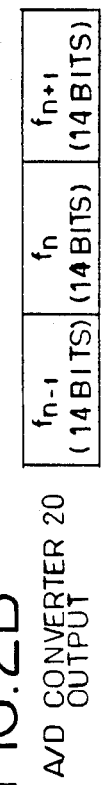
FIG.2G ANALOG INPUT
FIG.2B A/D CONVERTER 20 OUTPUT
FIG.2C COMPRESSION FILTER-30 OUTPUT W/O TRUNCATION
FIG.2D ENCODER-40 OUTPUT
FIG.2E DECODER-66 OUTPUT
FIG.2F RECONSTRUCTION FILTER-70 OUTPUT WITH ARITHMETIC WORD LENGTH TRUNCATION FIG-5
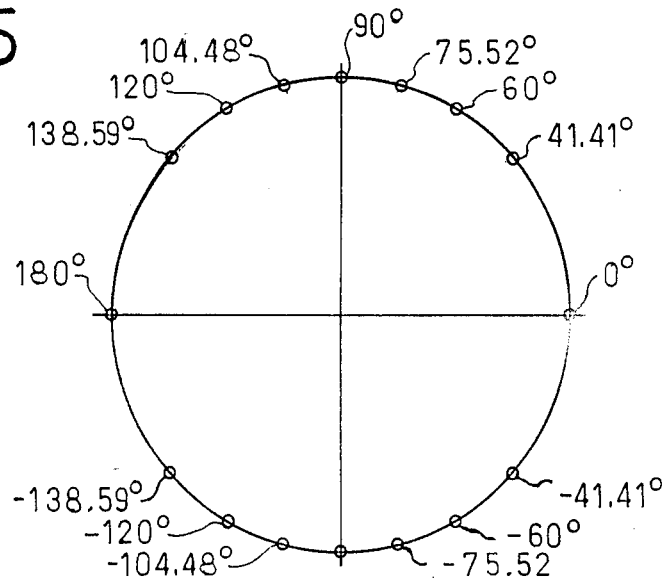
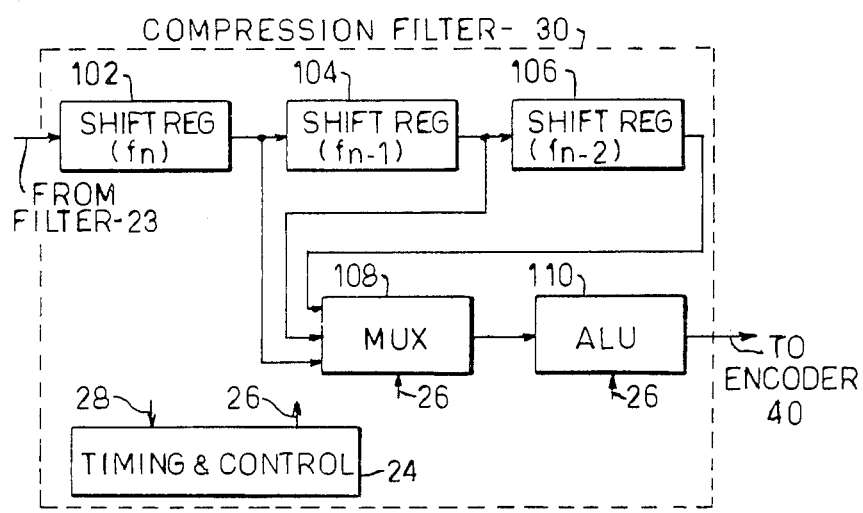
FIG-6

| $\Delta_n$ | CODE | PROBABILITY | WORD LENGTH |
|---|---|---|---|
| -3 | 0 0 0 0 0 0 0 1 | LEAST | 8 |
| 3 | 0 0 0 0 0 0 1 | ↓ | 7 |
| else(-4) | 0 0 0 0 0 1 |  | 6 |
| -2 | 0 0 0 0 1 |  | 5 |
| 2 | 0 0 0 1 |  | 4 |
| -1 | 0 0 1 |  | 3 |
| 1 | 0 1 | ↓ | 2 |
| 0 | 1 | GREATEST | 1 |
FIG-7
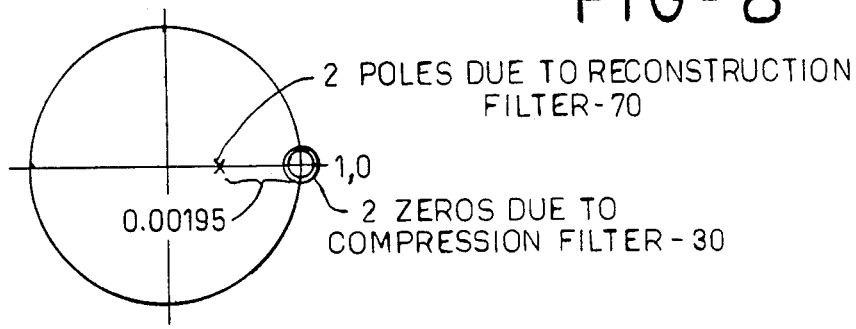
FIG-8
FIG-9

DATA COMPRESSION SYSTEM AND METHOD FOR AUDIO SIGNALS

RELATED APPLICATIONS

This is a continuation-in-part application of U.S. patent application Ser. No. 560,610 filed Dec. 12, 1983 by Charles S. Weaver, entitled "Data Compression System and Method for Audio Signals," now abandoned, which, in turn, is a continuation-in-part of U.S. patent application Ser. No. 202,457 filed Oct. 31, 1980 by Charles S. Weaver, entitled "Method and Apparatus for Digital Data Compression," now U.S. Pat. No. 4,449,536, issued May 22, 1984.

BACKGROUND OF THE INVENTION

Systems which include means for converting analog signals to digital form, then compression filtering and Huffman encoding the signals for recording or for transmission to a remove location, together with playback or receiver means which include a Huffman decoder, a digital reconstruction filter and means for converting the decoded and filtered digital signals back to analog form are shown in the above-identified U.S. Pat. No. 4,449,536, and in an article by U. E. Ruttimann and H. V. Pipberger entitled, "Compression of the ECG by Prediction or Interpolation and Entropy Encoding", *IEE Transactions on Biomedical Engineering*, Vol. BME-26, No. 11, pp. 613-623, November, 1979. A similar system is shown in an article by K. L. Ripley and J. R. Cox, Jr. entitled, "A Computer System for Capturing Transient Electrocardiographic Data", *Pro. Comput. Cardiol.* pp. 439-445, 1976. The above teachings employ a digital compression filter consisting of one or two zeros at dc frequency as a means of reducing the variance, or energy, of the signal prior to the Huffman encoding. As will become apparent, minimizing the variance of the signal prior to encoding does not, in general, reduce the bit rate needed for accurate transmission of the encoded waveform representation, and that only certain filter constructs achieve this objective, known more properly as minimizing the entropy of the signal.

SUMMARY OF THE INVENTION

Audio signals, such as music, to be transmitted, or recorded, are converted to digital form by analog to digital converter means. The digital signals then are supplied to a digital compression filter to generate digital, compressed signals. The compressed audio signals are supplied to an encoder, such as a truncated Huffman encoder, for encoding the same. The digital output from the encoder is recorded by use of digital recording means, and/or transmitted to a remote receiving location. At a playback unit or receiving station the encoded signal is decoded by a decoder, and the decoded signal is supplied to a digital decompression filter. The output from the decompression filter is converted to analog form by digital to analog converter means to provide a reproduction of the audio signals. A digital compression-decompression filter combination is used which minimizes the average bit length of the recorded, or transmitted, digital signal words. The transfer function of the digital compression filter means consists of zeros on the unit circle in the Z-plane, and the transfer function of the digital decompression filter consists of poles on or just inside the unit circle in the Z-plane at matching angles to the zeros of the compression filter (equivalent to frequencies relative to the sample rate). Compression filter operation is performed without truncation, or round-off, whereas decompression filter operation is with truncation, or round-off.

In accordance with the present invention, the zeros of the compression filter are restricted to nine specific frequency points in the Z-plane on the unit circle, namely, 0°, 41.41°, 60°, 75.52°, 90°, 104.48°, 120°, 138.59°, and 180°, where 0° represents zero frequency, or dc, 180° represents Fs/2 (where Fs is the sampling rate), and the other frequencies can be computed in direct proportion to these values. Any number of zeros may be placed at any or all of the above frequencies to form a particular compression filter, thereby creating a large (substantially infinite) set of possible filters. The optimum filter for any given sample waveform will be the one from this set which produces the lowest variance relative to the others from this set. (Shifting the zeros to any other location could lower the signal variance still further, but will at the same time increase the entropy of the resulting Huffman coded signal required to give a faithful rendering of the waveform following decoding.) An associated decompression filter is employed which has poles at, or inside, the unit circle adjacent the location of the compression filter zeros. For music signals, the compression filter for most input signal segments will include two zeros at dc, and the associated decompression filter will include two poles at 0° but shifted just inside the unit circle by a factor of, say, $2^{-9}$. The resultant system response has a low frequency cut-off of between 0-15 Hz to accommodate audio frequency signals which range, approximately, from 15 Hz to 20,000 Hz. For other input signal segments, the filters will include one or more zeros and poles at one or more of the above-mentioned permissible angular positions.

BRIEF DESCRIPTION OF THE DRAWINGS

The invention will be better understood from the following description when considered with the accompanying drawings. In the drawings, wherein like reference characters refer to the same parts in the several views:

FIGS. 2B to 2G show a waveform and graphic representations of signals appearing at various locations in the data compression system shown in FIGS. 1A and 1B;

FIG. 5 shows a plurality of Z-transform zero positions which are the only zero positions that may be employed in the compression filters included in systems of this invention;

FIG. 6 is a block diagram showing datails of a compression filter of the type which may be used in the present system;

FIG. 7 is a table showing a truncated Huffman code of a type which may be used in the present invention;

FIG. 8 shows a permissible zero-pole pattern of a compression-reconstruction filter combination which results in a stable system without the need for error detection;

FIG. 9 shows the frequency response of the compression-reconstruction filter combination having the zero-pole pattern illustrated in FIG. 8;

Figure 1A:
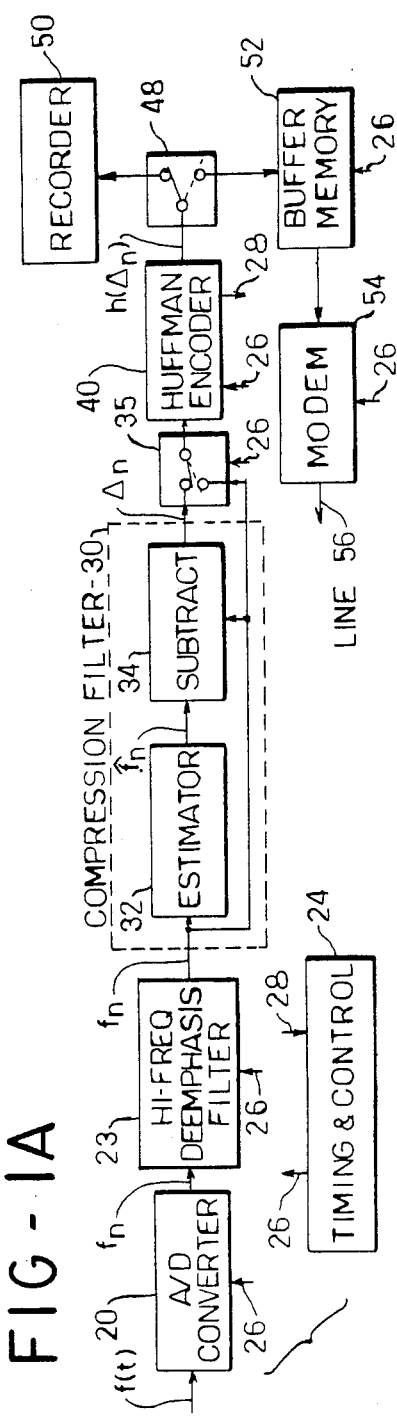
FIGS. 1A and 1B together show a block diagram of a data reduction system; a digital recording and transmitter section being shown in FIG. 1A and a playback and receiver section being shown in FIG. 1B.

Reference first is made to FIG. 1A wherein the digital recording and transmitting portion of a data compression system is shown comprising an analog to digital converter (A/D converter) 20 for conversion of an analog audio signal f(t) into digital form, the $n^{th}$ sample from the analog to digital converter 20 being identified as $f_n$. At FIG. 2G, an analog signal 22 is shown which comprises an input to the analog to digital converter 20. For purposes of illustration, the audio input signal may comprise a music signal which ranges in frequency from approximately 15 to 20,000 Hz. The form of the analog to digital converter output, shown at B of FIG. 2, comprises samples $f_{n-1}$ through $f_{n+i}$ of equal length words. The analog to digital converter 20 operates at a sampling rate established by control signals from a timing and control unit 24 supplied thereto over timing line 26. As employed herein, line 26 from the timing and control unit 24 represents a plurality of timing circuit outputs, one or more of which are supplied to the system elements for proper system timing and control. Inputs also are supplied to the timing and control unit 24 over line 28 for control thereof by signals from various other system elements. The A/D converter 20 operates in a conventional manner at a fixed sampling rate and with a fixed word length output. For purposes of description only, and not by way of limitation, the A/D converter may operate at a sampling rate of 44 KHz and with a 14 bit word length.

Figure 2A:
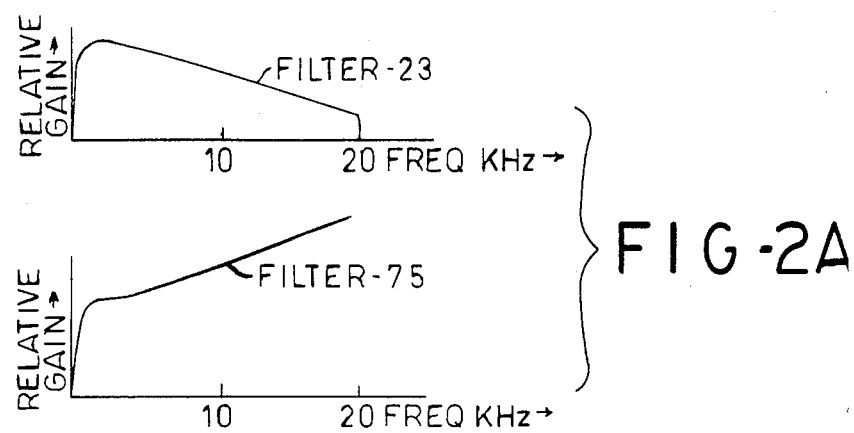
FIG. 2A shows the frequency response of high frequency deemphasis and high frequency emphasis filters which are included adjacent the input and output, respectively, of the data reduction system.

The output from the A/D converter 20 is supplied to a digital compression filter 30 through a digital filter 23 which deemphasizes the high frequency portion of the digital audio frequency signal from the A/D converter 20 to reduce the signal entropy. The frequency response of filter 23, together with the frequency response of a digital filter 75 included in the playback and receiver portion of the system is shown in FIG. 2A. For simplicity, the digital output from filter 23, as well as the digital input, is identified as $f_n$. Obviously, an analog filter having a similar frequency response may be included at the input to the A/D converter 20 in place of the digital filter 23 at the output therefrom.

For present purposes, the digital compression filter 30 is shown to include an estimator 32 and subtracting means 34. The estimator 32 provides an estimate of $f_n$, here identified as $\hat{f}_n$, based upon actual samples occurring both before and after the sample $f_n$ to be estimated. Estimators for providing such estimated $f_n$ values are, of course, well known. A difference signal $\Delta_n$ is produced by the compression filter 30 comprising the difference between the actual signal input $f_n$ and the estimated signal value $\hat{f}_n$ by subtraction of the estimated value from the actual value at subtracting means 34, as follows:

$$\Delta_n = f_n - \hat{f}_n \qquad (1)$$

In the graphic signal representation of the compression filter output shown at C in FIG. 2, difference signals $\Delta_n, \Delta_{n+1}, \Delta_{n+2}, \ldots \Delta_{n+i}$ are shown. In accordance with one feature of this invention, arithmetic operations of the digital compression filter 30 are performed without truncation or round-off whereas arithmetic operations of an associated digital decompression, of reconstruction filter, described below, are performed with truncation, or round-off. As seen in FIG. 2C, the compression filter output comprises untruncated compressed signals which are 18 bits in length.

It here will be understood that the present invention is not limited to use with the illustrated compression filter in which the output $\Delta_n$ comprises the difference between the actual signal input $f_n$ and an estimated value $\hat{f}_n$. Other compression filters may be used having different transforms in which the compression filter output $\Delta_n$ is not a direct function of the difference between the actual input $f_n$ and an estimated value thereof, $\hat{f}_n$. The use of the term "difference" signal values $\Delta_n$ is intended to also identify the output from other suitable compression filters.

It here will be noted that regardless of how the compression filter is implemented, zeros thereof in the Z-plane are located on the unit circle at only one or more of the above-identified angular positions, i.e. at 0°, 41.41°, 60°, 75.52°, 90°, 104.48°, 120°, 138.59° and 180°. The compression filter does not include zeros at any other positive angular positions. Although operation of compression filters with one or more zeros on the unit circle in the Z-plane at 0° is known, as shown for example in the above-mentioned Ruttimann et al and Ripley et al. articles, prior art compression filters are not operated with zeros at one or more of the above-identified angular positions and not at intermediate angular positions in the Z-plane.

Figure 3:
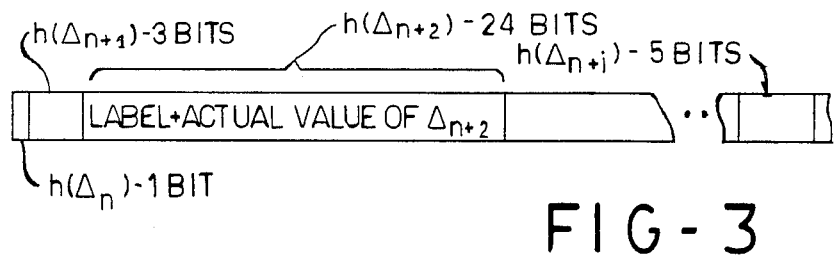
FIG. 3 is a graphic representation of encoded difference signals showing the format employed for encoding those difference signals which are outside a predetermined signal range.

The compression-filtered signal values $\Delta_n$ are supplied, through switch 35, to an encoder 40 employing a truncated Huffman code for encoding the same. Huffman encoding is disclosed in copending U.S. patent application Ser. No. 207,728, filed Nov. 17, 1980, entitled "Method and Apparatus for digital Huffman Encoding" by Charles S. Weaver, now U.S. Pat. No. 4,396,906, issued Aug. 2, 1983, which application is assigned to the same assignee as the present invention. The entire disclosure of said U.S. patent application Ser. No. 207,728 specifically is incorporated by reference herein. Briefly, the Huffman encoding technique makes use of the fact that the compression filter reduces the entropy of the signal output, $\Delta_n$ so that there can be a reduction in the total number of bits in the Huffman encoded signal over the input signal. A single code word is assigned to infrequently occurring difference signals, and supplied as a label for the actual difference signal value $\Delta_n$. In FIG. 1A, the encoder 40 output is designated $h(\Delta_n)$ and, at D in FIG. 2, the values $h(\Delta_n)$, $h(\Delta_{n+1})$ etc. represent encoded values of $\Delta_n$, $\Delta_{n+1}$, etc. The most frequently occurring value of $\Delta_n$ (here zero) is encoded using the shortest code word. A truncated Huffman code is disclosed in U.S. patent application Ser. No. 207,728, now U.S. Pat. No. 4,396,906, issued Aug. 2, 1983, which is readily implemented using a simple encoder and decoder. The encoder 40 output comprises code words for the most frequently occurring values of $\Delta_n$, together with a combined code word label and actual value of the signal $\Delta_n$ for less frequently occurring values of $\Delta_n$. For purposes of illustration, if the compression-filtered signal value exceeds $\pm 3$ then the actual signal $\Delta_n$ together with a code word label is produced at the encoder output. At FIG. 3, wherein several encoded values are shown, it will be seen that the encoded value for $\Delta_{n+2}$ comprises a label together with the actual signal $\Delta_{n+2}$, wherein $\Delta_{n+2}$ comprises an infrequently occurring signal value; that is, some value outside the range of $\pm 3$.

The encoded signals from encoder 40 are recorded and/or transmitted to a remote receiver. For recording, the encoder output is connected through a switch 48 to a recording unit 50 for recording of the encoded difference signals, labeled $h(\Delta_n)$ signals. With the switch 48 in the other, broken line, position, the encoder output is supplied to a buffer memory 52 and thence to a digital modem 54 for transmission over transmission line 56. In certain embodiments of this invention, check bits are generated for recording and/or transmitting along with encoded compressed signals $h(\Delta_n)$. In some embodiments of the invention, digital input signals $f_n$ sometimes are supplied to the input of the Huffman encoder through switch means 35, which signals serve to initialize, or reinitialize, the associated digital reconstruction filter described below.

Figure 1B:
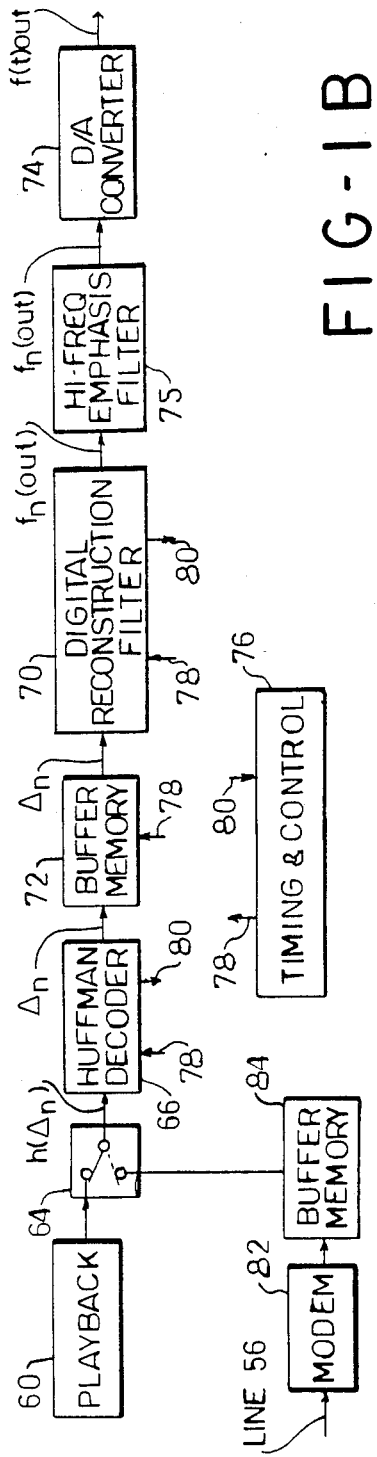

Recorded encoded digital signals, such as those recorded at recording unit 50 of FIG. 1A are reproduced using the system shown in FIG. 1B, which system includes a playback unit 60. Recorded encoded digital signals from the playback unit 60 are supplied through switch 64 to a decoder 66 for decoding the truncated Huffman encoded signals. At the decoder 44, the Huffman code words are converted to the original compression-filtered signals $\Delta_n$. Where the Huffman code word comprises a labeled actual compressed signal, the label is stripped therefrom, and the actual compression filter signal without the label is supplied to the decoder output. Encoding and decoding means which may be used in the present invention are described in detail in the above-mentioned U.S. Pat. No. 4,396,906. Coding and decoding are discussed in greater detail below under the heading "Encoding-Decoding".

The signals $\Delta_n$ from the decoder 66 are supplied to a reconstruction, or decompression, filter 70 through a buffer memory 72. The bit rate of the decoder varies, and the buffer memory 72 is included to accommodate the input rate requirements of the reconstruction filter 70. The reconstruction filter 70 converts the compression filter output signals $\Delta_n$ to signals $f_n$(out) which closely match the input sample signals $f_n$ to the compression filter 30. As noted above, one feature of this invention involves compression filtering without truncation and decompression filtering with truncation. In FIG. 2F, the truncated reconstruction filter output $f_n$(out), $f_{n+1}$(out) etc. is shown to comprise words of 24 bits. Without truncation, the reconstruction filter would be required to handle word lengths of approximately 36 to 40 bits which, for consumer products, is not new feasible at reasonable cost. Reasons that suitable data compression with minimum distortion is obtained using a compression-decompression filter combination wherein compression filtering is effected without truncation and decompression filtering is effected with truncation will become apparent hereinbelow.

A digital to analog converter (D/A converter) 74 converts the signal samples $f_n$(out) from the digital reconstruction filter 70 to analog form, for reproduction of the analog signals. A digital filter 75 which emphasizes the high frequency components of the signal output is included in the connection of the output from the digital reconstruction filter output to the D/A converter. The frequency response of the filter 75 is shown in FIG. 2A, adjacent to the frequency response of the input filter 23. For simplicity, the same symbol $f_n$(out) is employed at the input and output of the filter 75. Obviously, an analog filter having a similar frequency response may be included in the output from the D/A converter, in place of the digital filter 75. A receiver timing and control unit 76 supplies timing signals to the various receiver elements over line 78 for proper timing of the receiving operation. Also, control signals for the unit 76 are supplied thereto over line 80 from various elements of the receiver for control thereof.

For transmission without recording, the encoded signals are transmitted over line 56 (from FIG. 1A to FIG. 1B) to a digital modem 82 at the receiver. The modem output is buffered by buffer memory 84, and the buffer memory output is supplied through switch 64 in the broken line position to the decoder 66 for decoding and subsequent processing in the manner described above.

DIFFERENCE EQUATIONS AND Z-TRANSFORMS

Compression and reconstruction filter difference equations for implementation by the digital compression and reconstruction filters 30 and 70, to provide for zeros and poles, respectively, at the above-identified positive angular positions of 0°, 41.41°, 60°, 75.52°, 90°, 104.48°, 120°, 138.59° and 180° are listed below, together with the corresponding Z-transforms of the compression filters. The zeros of the compression filters are located on the unit circle, and the poles of the construction filters are located inside the unit circle by a distance of $2^{-m}$.

One zero and one pole at 0° in the Z-plane

The compression filter difference equation is $$\Delta_n = f_n - f_{n-1} \qquad (2)$$

The Z-transform is $$G(Z) = 1 - Z^{-1} \qquad (3)$$

The reconstruction filter difference equation is $$y_n = \Delta_n + y_{n-1} - 2^{-m} y_{n-1} \qquad (4)$$

Two zeros and two poles at 0° in the Z-plane
The compression filter difference equation is $$\Delta_n = f_n - 2f_{n-1} + f_{n-2} \tag{5}$$

The Z-transform is $$G(Z) = 1 - 2Z^{-1} + Z^{-2} \tag{6}$$

The reconstruction filter difference equations are $$y_n = \Delta_n + y_{n-1} - 2^{-m} y_{n-1} \tag{7}$$

and $$f_n = y_n + f_{n-1} - 2^{-m} f_{n-1} \tag{8}$$

One zero and one pole at 180° in the Z-plane
The compression filter difference equation is $$\Delta_n = f_n + f_{n-1} \tag{9}$$

The Z-transform is $$G(Z) = 1 + Z^{-1} \tag{10}$$

The reconstruction filter difference equation is $$y_n = \Delta_n - y_{n-1} - 2^{-m} y_{n-1} \tag{11}$$

Two zeros and two poles at 180° in the Z-plane
The compression filter difference equation is $$\Delta_n = f_n + 2f_{n-1} + f_{n-2} \tag{12}$$

The Z-transform is $$G(Z) = (1 + Z^{-1})^2 \tag{13}$$

The reconstruction filter difference equations are $$y_n = \Delta_n - y_{n-1} - 2^{-m} y_{n-1} \tag{14}$$

and $$f_n = y_n - y_{n-1} - 2^{-m} y_{n-1} \tag{15}$$

Zeros and poles at ±90° in the Z-plane
The compression filter difference equation is $$\Delta_n = f_n + f_{n-2} \tag{16}$$

The Z-transform is $$G(Z) = 1 + Z^{-2} \tag{17}$$

The reconstruction filter difference equation is $$y_n = \Delta_n - y_{n-2} + 2^{-m} y_{n=2} \tag{18}$$

Zeros and poles at ±60° in the Z-plane
The compression filter difference equation is $$\Delta_n = f_n - f_{n-1} + f_{n-2} \tag{19}$$

The Z-transform is $$G(Z) = 1 - Z^{-1} + Z^{-2} \tag{20}$$

The reconstruction filter difference equation is $$y_n = \Delta_n + y_{n-1} - 2^{-m} y_{n-1} - y_{n-2} + 2^{-m+1} y_{n-2} - 2^{-2m} y_{n-2} \tag{21}$$

Zeros and poles at ±120°
The compression filter difference equation is $$\Delta_n = f_n + f_{n-1} + f_{n-2} \tag{22}$$

The Z-transform is $$G(Z) = 1 + Z^{-1} + Z^{-2} \tag{23}$$

The reconstruction filter difference equation is $$y_n = \Delta_n - y_{n-1} + 2^{-m} y_{n-1} - y_{n-2} + 2^{-m+1} y_{n-2} - 2^{-2m} y_{n-2} \tag{24}$$

Zeros and poles at ±41.41°
The compression filter difference equation is $$\Delta_n = f_n - 1.5 f_{n-1} + f_{n-2} \tag{25}$$

The Z-transform is $$G(Z) = 1 - 1.5 Z^{-1} + Z^{-2} \tag{26}$$

The reconstruction filter difference equation is $$y_n = \Delta_n + 1.5 y_{n-1} - (2^{-m} 1.5 y_{n-1}) - y_{n-2} + 2^{-m+1} y_{n-2} - 2^{-2m} y_{n-2} \tag{27}$$

Zeros and poles at ±75.52°
The compression filter difference equation is $$\Delta_n = f_n - 0.5 f_{n-1} + f_{n-2} \tag{28}$$

The Z-transform is $$G(Z) = 1 - 0.5 Z^{-1} + Z^{-2} \tag{29}$$

The reconstruction filter difference equation is $$y_n = \Delta_n + 0.5 y_{n-1} - (2^{-m} 0.5 y_{n-1}) - y_{n-2} + 2^{-m+1} y_{n-2} - 2^{-2m} y_{n-2} \tag{30}$$

Zeros and poles at ±104.48°
The compression filter difference equation is $$\Delta_n = f_n + 0.5 f_{n-1} + Z f_{n-2} \tag{31}$$

The Z-transform is $$G(Z) = 1 + 0.5 Z^{-1} + Z^{-2} \tag{32}$$

The reconstruction filter difference equation is $$y_n = \Delta_n - 0.5 y_{n-1} - (2^{-m} 0.5 y_{n-1}) - y_{n-2} + 2^{-m+1} y_{n-2} - 2^{-2m} y_{n-2} \tag{33}$$

Zeros and poles at ±138.59°
The compression filter difference equation is $$\Delta_n = f_n + 1.5 f_{n-1} + Z f_{n-2} \tag{34}$$

The Z-transform is $$G(Z) = 1 + 1.5 Z^{-1} + Z^{-2} \tag{35}$$

The reconstruction filter difference equation is $$y_n = \Delta_n - 1.5y_{n-1} - (2^{-m}1.5y_{n-1}) - y_{n-2} + 2 - {}^1y_{n-2} - 2 - {}^{2m}y_{n-2} \quad (36)$$

In the above-listed compression filter equations, $f_n$ = the nth input to the compression filter, and $\Delta_n$ = the nth output from the compression filter. In the above-listed reconstruction filter equations, $\Delta_n$ = the nth input to the reconstruction filter, $y_n$ = the nth output from the reconstruction filter, m = an integer of between say 9 and 4, for reconstruction filters with poles inside the unit circle and equals infinity for reconstruction filters with poles on the unit circle.

It here will be noted that all numerical coefficients of the compression filter difference equations are limited to values of 1, 2, ½ and 3/2. For reasons which will become apparent hereinbelow, any other coefficients are unsatisfactory since operation of the compression filter without truncation would, in fact, or as a practical matter, not be possible because of the large increase in the entropy of the $\Delta_n$.

QUANTIZATION OF ANALOG MUSIC SIGNALS

For purposes of illustration, and not by way of limitation, a music analog signal is considered for an input to the present system of this invention.

Figure 4:
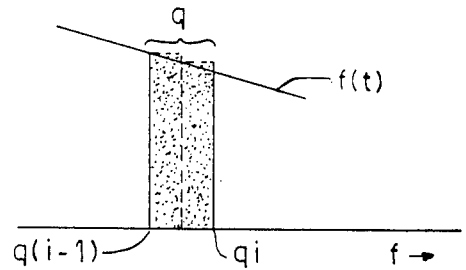
FIG. 4 is a graph for use in showing the relationship between the probability that a digital sample signal value will occur within a certain quantization level and the size of the quantization level.

The entropy of a binary analog to digital (A/D) converted x bit long sample is $$H(q) = \sum_{i=1}^{2^x} -P_i \log_2 P_i \quad (37)$$

where there are $2^x$ possible values of the sample and $P_i$ is the probability that the ith possible value will occur. Let the size of the quantization level be q and, for simplicity, assume that the ith quantization, which gives the ith value, is from $q(i-1)$ to $q(i)$. Then, as seen in FIG. 4, the signal before analog to digital conversion will fall in the range $q(i-1)$ to $q(i)$. In FIG. 4, the shaded area is the probability that the signal $f(t)$ falls into the ith quantization.

Now, assume further that the size of the quantization level, q, is small compared to the standard deviation, $\sigma$, of the analog music signal. If the A/D converter word length is increased by one bit, the quantization size is cut in half and, as shown by dashed lines in FIG. 4, two quantization bins are formed from the original bin. For small q, the areas on either side of the vertical dashed line will be almost equal whereby the probability that $f(t)$ will fall into one of the two new bins is approximately $P_i/2$. Therefore, the contribution of the two new bins to the entropy of the n+1 bit long word very nearly is $$-2\left[\frac{P_i}{2} \log_2 \frac{P_i}{2}\right] \quad (38)$$

$$= -2\left[\frac{P_i}{2}(\log_2 P_i - 1)\right]$$

$$= -P_i \log_2 P_i + P_i$$

The entropy of the (x+1) bit long word is $$H\left(\frac{q}{2}\right) = \sum_{i=1}^{2^x} -P_i\log_2 P_i + \sum_{i=1}^{2^x} P_i = H(q) + 1 \quad (39)$$

From the above, it will be seen that as the bit length is increased, the increase in entropy will converge to one bit for each bit added to the word length. The argument when the first quantization bin is centered about zero (the usual case) is slightly more complex, however, the result is the same.

The $P_i$ and entropies have been evaluated by numerical integration with various ratios of $\sigma$ to q for the Gaussian distribution. Table 1, below, of calculated entropies at different ratios of $\sigma/q$, shows that the entropies increase very closely to one bit each time q is cut in half or when the word length is increased by one.

TABLE 1

CALCULATED ENTROPY AS QUANTIZATION SIZE IS REDUCED

| $\sigma/q$ | Entropy (bits) |
|---|---|
| 0.5 | 0.58 |
| 1 | 1.16 |
| 2 | 1.93 |
| 4 | 2.82 |
| 8 | 3.77 |
| 16 | 4.75 |
| 32 | 5.73 |

COMPRESSION FILTERING OF QUANTIZED MUSIC SIGNALS

When a filter is applied to the music spectrum, the output signal has a new spectral shape and, hence, a different entropy from the original signal. For any particular filter (analog or digital), the new entropy is estimated as follows: the music spectrum S(f) is measured, and the integral $$\int |G(Z)|^2 S_Z(e^{j2\pi fT}) dZ \quad (40)$$

is determined along the unit circle from (1,0) to (−1,0), where $$S_Z(e^{j2\pi fT}) = S(f)$$

and G(Z) is the Z transform of the filter.

The square root of the integral is the standard deviation, $\sigma$, of the filter output. If the output of this filter is now digitized (analog to digital converted) with linear quantization level q, or if the original signal had been digitized and the filter realized digitally, again with quantization level q, Table 1 can be used to estimate H(q). This filter, with suitable coefficients, is referred to as a "compression filter".

The average word length of a Huffman encoder, such as encoder 40 to which the output from the compression filter 30 is supplied is bounded as follows:

$$H(q) \leq \text{average word length} < H(q) + 1 \quad (41)$$

If the compression filter is realized by digital means, its characteristics can be specified by the use of difference equations applied to samples of the input waveform. The novel part of this invention follows: If a coefficient in the difference equation(s) that is used to realize the compression filter has a non-integer value the quantization level at the filter output will be reduced; i.e., the minimum difference between possible output values will be decreased and H(q) will be increased. For example, consider the following two compressor equations to implement the compression filter transform.

$$\Delta_n = f_n - 2f_{n-1} + f_{n-2} \quad (42)$$

and $$\Delta_n = f_n - 2f_{n-1} + 2^{-m+1}f_{n-1} + f_{n-2} - 2^{-m+1}f_{n-2} + 2^{-2m}f_{n-2} \quad (43)$$

where m is a positive integer.

The Z-transform of Eq (42) has two zeros at (1,0) and Eq (43) has two zeros at $(1-2^{-m}, 0)$ in the Z-plane. The $\Delta_n$ in Eq. (42) will have values spaced a distance of q apart, but the $\Delta_n$ in Eq (43) can be spaced in increments of $2^{-2m}q$. When m is large, the $\sigma$ from both filters will be approximately equal but the $\sigma$/quantization level ratios will be significantly different; i.e., the quantization of the second filter (Eq.(43)) will be approximately $2^{2m}$ times the quantization of the first filter (Eq.(42)). Therefore, the entropy of the output of the first filter will be approximately 2m more bits than the entropy of the output of the second, and after Huffman encoding the average bit length will be approximately 2m bits longer per sample.

It will be noted that multiplying the right side of Eq (43) by $2^{2m}$ returns the quantization level to q, but the standard deviation is increased by a factor of $2^{2m}$ so that the ratio is unchanged.

Filter Weights Versus Word Length

A general form of a compression filter difference equation is $$\Delta_n = \sum_{i=1}^{1} a_i f_{n-i+1}, \quad (44)$$

where $a_i$ is a constant. If $a_i$ can be represented by a finite length binary number, it can be expressed as $$a_i = \sum_j b_{ij} 2^j, \quad (45)$$

where $b_{ij} = 0$ or $\pm 1$ and j can have positive or negative values. For example if, $a_i = 0.625$, $$a_i = 0 \times 2^0 + 1 \times 2^{-1} + 1 \times 2^{-2} + 0 \times 2^{-3} - 1 \times 2^{-4}.$$

Any negative j and a non-zero $b_{ij}$ means that $f_{n-1}$ is shifted right and added; $j_o$ bits must be added to the least-significant end of the arithmetic word, where $j_o$ is the most negative j with non-zero $b_{ij}$.

In other words, if the filter coefficients, $a_i$, are not integers, then the output samples will also have fractional values, and more bits must be expended to exactly represent the output values.

A general form of a compression filter transfer function Z-transform can be given as:

$$G(Z) = (1 - d_1 Z^{-1})^{n_1} (1 - d_2 Z^{-1})^{n_2} \ldots (1 - d_i Z^{-1})^{n_i} \quad (46)$$

which can be represented as $n_1$ zeros at $d_1$ in the Z-plane, $n_2$ zeros at $d_2$ in the Z-plane, etc. The $d_i$ are complex values which can be represented in polar coordinates, i.e., $(r_i, \theta_i)$. The ith term of G(Z) may be rewritten as:

$$G_i(Z) = (1 - (r_i \cos \theta_i - jr_i \sin \theta_i) Z^{-1})^{n_i} \quad (47)$$

which, for $n_i = 1$, has a magnitude of:

$$|G_i(Z)| = \sqrt{1 - 2r_i \cos \theta_i Z^{-1} + r_i^2 Z^{-2}} \quad (48)$$

to assure integer value coefficients, both $r_i$ and $2 \cos \theta_i$ must be integers, implying that $r_i = 1$ (all zeros lie on the unit circle in the Z-plane), and $\theta_i = 0°, 60°, 90°, 120°,$ or 180°. To assure that the filter term decreases q by no more than a single factor of two, we have $2 \cos \theta_i = \frac{1}{2}$ or 3/2, implying that $\theta_i = 41.41°, 75.52°, 104.48°,$ or 138.59°.

The above-described permissible zero positions are shown in FIG. 5. A single zero may be located at any of the identified positive angular positions between 0° and 180°. For positive angular zero complex positions between 0° and 180° a second zero is located at the corresponding negative angular position; i.e. complex pairs of zeros are required.

Any number of zeros may be used at any (or all) of these "frequencies" to make up the compression filter. The combination of zero positions employed, and the number of zeros placed at each point will be dependent upon the spectrum of the signal to be compressed. But any zero location other than these nine will (generally) result in a significant increase in entropy. Only in certain cases, such as narrow band tones, generally not of interest to music and other widely spread spectra, could a non-integer zero location reduce the entropy, by being able to reduce the variance by more than its coefficients increase the entropy by reducing q.

Of course, limitations are encountered when the number of zeros is increased. The amount of calculation required is directly proportional to the number of zeros, and the filter arithmetic word length increases by the sum of the magnitudes of the coefficients of the filter's difference equation. Also, recovery during reconstruction from bit errors will take longer as the number of zeros is increased.

Compression Filter

Although it will be apparent that standard digital techniques may be used for implementing the above described compression filter transforms, including the use of a programmed digital computer, a block diagram of a second order digital compression filter suitable for use in implementing the compression filter difference equations, including equation (42), is shown at FIG. 6, to which figure reference now is made. The illustrated compression filter includes a series of shift registers 102, 104, and 106 into which consecutive sample signals from the A/D converter, through filter 23, are shifted. In FIG. 6, for purposes of description, the registers, 102, 104 and 106 are shown to contain samples $f_n, f_{n-1}, f_{n-2}$, respectively. For 14-bit samples, 14-bit registers are employed. The register outputs are connected to a digital multiplexer 108 for selective connection of the sample signals to an arithmetic and logic unit (ALU) 110. The multiplexer 108 and ALU 110 are under control of timing and control unit 24.

As noted above in the description of FIG. 1A, the digital compression filter 30 may include an estimator 32 having an output comprising an estimated sample value $f_n$ based upon actual samples $f_{n-1}$ and $f_{n+1}$ occurring before and after the sample $f_n$ to be estimated. Often, prior art estimators are used which provide an output, $$f_n = a_1 f_{n+1} + a_2 f_{n-1} \quad (49)$$

where the coefficients $a_1$ and $a_2$ are chosen to minimize the mean square error of the difference $\Delta_n$, where $\Delta_n = f_n - \hat{f}_n$, as noted in equation (1), above. For $a_1 = a_2 = 1$, equations (1) and (49) may be combined to give $$\Delta_n = f_{n+1} - 2f_n + f_{n-1} \quad (50)$$

(It here will be noted that equations (42) and (50) are equivalent.)

Equation (50) may be utilized by the illustrated compression filter in the generation of the compression-filtered signal $\Delta_n$. An estimate $\hat{f}_n$ of the sample $f_n$ is made using the samples either side of $f_n$, i.e. $f_{n-1}$ and $f_{n+1}$, but not $f_n$ itself. Under control of unit 24, the words $f_{n-1}$ and $f_{n+1}$ are moved into the ALU 110 through the multiplexer 108 and added. The actual sample $f_n$ then is moved into the ALU 110 through the multiplexer 108, and multiplied by 2. Multiplying by 2 simply involves shifting of the bits toward the most significant bit. The actual sample $f_n$, multiplied by 2, is subtracted from the sum of $f_{n-1}$ and $f_{n+1}$ to provide the compression-filtered signal value $\Delta_n$ at the ALU 110 output, which then is supplied to encoder 40. The arithmetic in the ALU 110 is done in a word length sufficiently long to ensure against truncation or round-off error. It will be seen that data compression by the above-described apparatus includes estimating a sample value by interpolation. With proper timing and control, the compression filter of FIG. 6 may be operated with zeros at any of the above-identified permissible angular positions, i.e. it may be used to implement any of the above-identified compression filter difference equations wherein the zeros are located on the unit circle in the Z-plane.

HUFFMAN ENCODING AND DECODING

As noted above, Huffman encoding and decoding means suitable for use in the present system for encoding and then decoding the compression filter output are disclosed in copending U.S. patent application Ser. No. 207,728 filed Nov. 17, 1980 entitled, "Method and Apparatus for Digital Huffman Encoding" by the present inventor, which application is incorporated by reference herein.

Reference is made to FIG. 7 wherein an example of a truncated Huffman code is shown for purposes of illustration only and not by way of limitation. There, a table of compression-filtered signals, $\Delta_n$, ranging from $\pm 3$ is shown together with a code word for said signals, the length of the code word, and the relative probability of occurrence of said compressed signals. The $\Delta_n$ which occur most frequently (here those between $\pm 3$) are assigned the shortest code words. In the table, the most frequently occurring $\Delta_n$, $\Delta_n = 0$, is assigned the shortest code word, and the least frequently occurring signal, $\Delta_n = -3$, is assigned the longest code word. The probability of $\Delta_n$ comprising a value which is between $\pm 3$ is high, say, 0.98. All other $\Delta_n$ outside the range of $\pm 3$ are identified as *else* in the table, and these are assigned a code word which, as described above with reference to FIGS. 2 and 3, indicates that the next 14 bits, for example, represent the actual value of $\Delta_n$ which subsequently is transferred by way of recording, transmission over a communications link, or the like. Obviously, the system is not limited to use with the illustrated truncated Huffman code. Additional compression-filtered signals, $_n$, may be assigned a code word, and other code words may be employed.

RECONSTRUCTION FILTERING

Entropy Versus Reconstruction Filter Stability

For exact reconstruction of the digital music signal supplied to the digital compression filter 30, the reconstruction filter 70 transfer function would have to be the inverse of the compression filter 30 transfer function:

$$R(Z) = \cfrac{1}{\prod_{i=1}^{m} (1 - r_i \cos\theta_i Z^{-1} - j r_i \sin\theta_i Z^{-1})^{n_i}} \quad (51)$$

(Two other necessary conditions for exact reconstruction are that there be no over- or under-flow errors in the filter arithmetic and that there be no truncation of the compression filter output word length.)

As shown above, minimum entropy is obtained when the zeros of the compression filter transfer function are on the unit circle, and the frequencies of the zeros are such that the term $2 \cos\theta$ is an integer (or at worst, $\pm 0.5$ or $\pm 1.5$), where $\theta = 360° \, f/F_s$, f is the frequency of the zero, and $F_s$ is the system sampling rate. The exact inverse has poles on the unit circle in the same positions as the compression filter zeros. Such a reconstruction filter is unstable. Such instability is satisfactory until a bit error occurs whereupon incorrect, and random, "initial conditions" cause the reconstruction filter to diverge to saturation. Various techniques are available to provide a stable output. For completeness two different systems are described hereinbelow for use with arrangements wherein the compression-reconstruction filter combination is unstable which systems provide for recovery from bit errors.

Briefly, one system includes the periodic transfer of a plurality of actual digital signal values internal to the digital reconstruction filter 70 to periodically reinitialize the same. For example, if Eqs. (7) and (8) were used, $f_{n-1}$ and $y_{n-1}$ would periodically be transferred so that if any error has occurred correct reconstruction could begin when $\Delta_n$ is received. This, of course, requires blocking of the signal and, without very complex and highspeed logic, the loss of data from the point of the error until the end of the block.

Another system includes the use of check bits and error checking means for production of a bit error signal whenever an error is detected. The error signal is used to momentarily move the poles of the reconstruction filter 70 inwardly of the unit circle, during which time the filter 70 recovers from errors without the need to reinitialize the filter with actual signal values $f_n$. The poles are moved by changing the coefficients of the reconstruction filter from $r_i = 1$ to, say, $r_i = 1 - 2^{-9}$ for a brief, fixed interval of time. By locating the poles of the reconstruction filter inside the unit circle, the filter is stable and incorrect "initial conditions", due to errors, will damp out. Under these conditions, the filter is stable and no blocking is required for recovery from errors. Stable filter combinations of this type also are described in further detail hereinbelow.

Compression Filter Zeros Inside Unit Circle Unsatisfactory

It here will be noted that poles of an exact inverse are off the unit circle if the compression zeros are not on the unit circle. However, such a compression-reconstruction filter combination is not practical for music data compression as will become apparent from the following example. If the compression filter transfer function contains two real zeros near the 1,0 point, they must be at a distance from the unit circle that is less than $\pi \times 200/22000$ (the distance around the unit circle that corresponds to 200 Hz). A larger distance means that the low frequency components will not be as highly attenuated. Since $0.00909 = 2^{-7}$, the zero would be $$[1-(1-2^{-7})Z^{-1}].$$

Therefore, if two zeros were used, there would be a coefficient equal to $2^{-14}$, and 14 bits would be added to the least significant end of the filter arithmetic. With no truncation, approximately 14 bits would be added to the entropy and little data compression would be possible.

Another compression-reconstruction filter combination which is not suitable for use in the present system, also includes arrangements wherein both the zeros of the compression filter and the poles of the reconstruction filter are off the unit circle. With these arrangements there is no arithmetic word length truncation, however, the output of the compression filter is truncated to a length that is one or two bits longer than the analog to digital converter word length. Letting the output quantization level equal $q_o$, the quantizing noise power will have a variance of $$\sigma_{q_o}^2 = \frac{q_o^2}{12} \tag{52}$$

and the noise will be white. The reconstruction distortion will be equal to the output noise due to a noise generator at the reconstruction filter input that has a variance that is given by equation (52).

Since the input noise samples are white and statistically independent, it can be shown that the output noise variance is $$\sigma_o^2 = \sigma_{q_o}^2 \sum_{i=0}^{\infty} g_i^2 \tag{53}$$

or $$\sigma_o = \sigma_{q_o} \left( \sum_{i=0}^{\infty} g_i^2 \right)^{\frac{1}{2}} \tag{54}$$

where $g_i$ is the ith value (at the ith sampling time) of the impulse response of the reconstruction filter. In other words, the square root of the sum-of-the-squares of the impulse response samples is the standard deviation multiplier. This multiplier has been calculated for different pole positions by solving the appropriate difference equation. From the calculations it has been determined that noise power produced by such truncation of the compression filter output is too large, or is concentrated within such a small portion of the signal bandwidth, so as to produce undesirable sound in the music output. Consequently, truncation of the compression filter output words is unsatisfactory for music data compression.

Reconstruction Filter Not an Exact Inverse of Compression Filter

If there are no bit errors in the transfer of the compression filter 30 output to the input of the digital reconstruction filter, and no truncation of the compression filter 30 output, the output from the Huffman decoder 66 is identical to the output from the compression filter 30. Thus, it will be understood that the transfer from the input to the compression filter 30 to the output of the reconstruction filter 70 is simply the product of the transforms of the two filters 30 and 70. Another data compression system which embodies the present invention includes a compression-reconstruction filter combination wherein the zeros of the compression filter are at one or more of the above-identified specific points on the unit circle to reduce the entropy, and corresponding poles of the reconstruction filter are located inside the unit circle, adjacent said zeros for stability. The frequency response and stability of such compression-reconstruction filter combinations are readily calculated. Consider, for example, a compression-reconstruction filter combination wherein the compression filter has two zeros at (1,0) and the reconstruction filter has two poles at $(1-0.00195, 0)$. The pole-zero pattern of such a compression filter cascaded with a reconstruction filter is shown in FIG. 8, and the frequency response of the filter combination is shown in FIG. 9. As seen in FIG. 9, the combination provides a very flat high-pass filter with a 18 Hz cut-off. With this filter combination, recovery from bit errors is within 20-30 ms. It here will be noted that the reconstruction filter 70 employed herein preferably comprises a digital computer programmed for the desired reconstruction filter operation.

Word Length Considerations in the Reconstruction Filter

A stable reconstruction filter, operating without truncation, would require a large arithmetic word length. For example, the above-described-real-pole 18 Hz filter would require at least 34 bit arithmetic ($0.00195 = 2^{-9}$), at least 9 bits per pole on the least significant end and 1 bit on the most significant end per pole when the analog to digital (A/D) word length is 14 bits. 4-pole configurations would require even longer arithmetic word length. Presently, computers operating with such large word lengths are not practical for consumer music data compression.

Fortunately, the reconstruction filter arithmetic words can be truncated to practical lengths with negligible system degradation. Arithmetic word truncation noise is analyzed in substantially the same manner as is the analysis of quantizing. For this analysis, noise generators with noise power $q^2/12$ (one generator for each coefficient) are added to the filter input and the input-to-output standard deviation multiplier is calculated also using Eq. (54). The value of q is the quantization level of the truncated arithmetic word.

For an 18 Hz 2-real-pole reconstruction filter, the multiplier is 3227. Then, the arithmetic work length must be 12 bits longer than the A/D word length or the arithmetic truncation noise power will be larger than the A/D quantizing noise power. Fourteen bit A/D conversion requires 26 or 27 bit reconstruction filter arithmetic. If the compression filter has two real zeros at (1,0) and two complex poles at 7 KHz on the unit circle, then a reconstruction filter having a complex pair of poles at the 20 Hz Butterworth position and a complex pair 7.33 KHz along the unit circle and 100 Hz in from the unit circle may be used. The standard deviation multiplier of such a reconstruction filter is 32, or 5 bits, and the frequency response of the compression-reconstruction filter combination is substantially the same as that shown in FIG. 9, except for a narrow notch at 7 KHz. With 24-bit arithmetic there is virtually no degradation of the signal. Digital computers with, say, 24 bit arithmetic for reconstruction filtering are available at a reasonable cost for use in the system of this invention.

Reconstruction Filter

Figure 10:
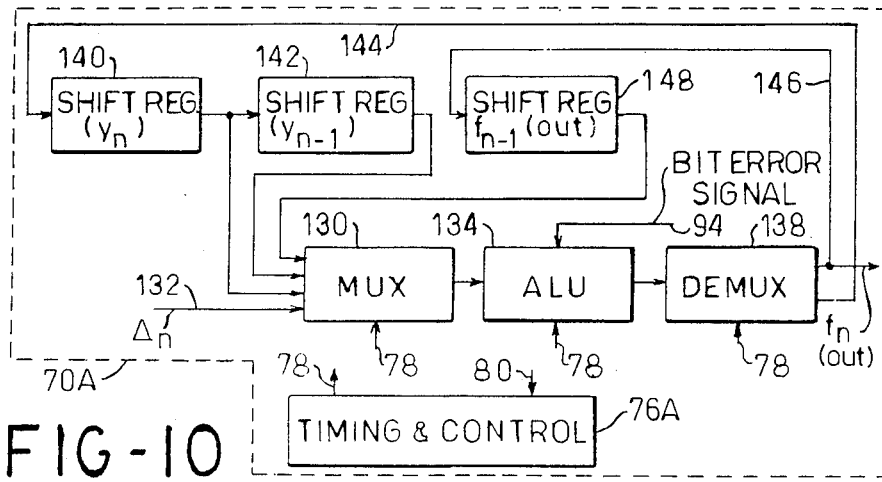
FIG. 10 is a block diagram showing details of a reconstruction filter which may be used in this invention.

A reconstruction filter for implementing equations (7) and (8) is shown in FIG. 10, to which figure reference now is made. The illustrated reconstruction filter 70A, comprises a 4 to 1 digital multiplexer 130 having one input 132 to which compressed signals $\Delta_n$ are supplied from the decoder 66. The output from the multiplexer 130 is supplied to an arithmetic and logic unit, ALU, 134 where the required multiplication by shifting, addition and subtraction takes place under control of timing and control unit 76A.

The output from ALU 134 is connected to the input of a 1 to 2 digital demultiplexer 138. One output of the demultiplexer 138 is connected to one register of a pair of series connected shift registers 140 and 142 over line 144. The other demultiplexer output is connected over line 146 to a single shift register 148. The value of $y_n$ determined by the ALU is loaded into register 140 while the prior value of $y_n$ is shifted from register 140 into register 142. The third register 148 is supplied with the sample value $f_n(\text{out})$ as calculated by the ALU 134.

Outputs from registers 140, 142, and 148 are supplied as inputs to the ALU 134 through the multiplexer 130. When used, the value stored in register 148 comprises $f_{n-1}(\text{out})$. From equation (8) it will be seen that the value $y_n$ is calculated using the $\Delta_n$ and $y_{n-1}$ inputs to ALU 134 available at line 132 and from register 142. From equation (7) it will be seen that the sample value $f_n(\text{out})$ is calculated using the $y_n$ and $f_{n-1}(\text{out})$ inputs from registers 140 and 148, respectively. With proper timing and control, the reconstruction filter shown in FIG. 10 may be used to implement any of the above-mentioned reconstruction filter difference equations. Obviously, the invention is not limited to use of the illustrated reconstruction filter 70A.

CASCADE CONNECTION OF FILTER ELEMENTS

The compression filter difference equations (2) and (8) which provide for one zero at 0° and one at 180°, respectively, and the corresponding reconstruction filter difference equations (4) and (11) which provide for one pole at 0° and one at 180°, respectively, comprise first order equations which may be implemented using first order filters. The other compression and reconstruction filter difference equations which provide for zeros and poles at allowable angular locations may be implemented using second order filters.

Figure 11A:
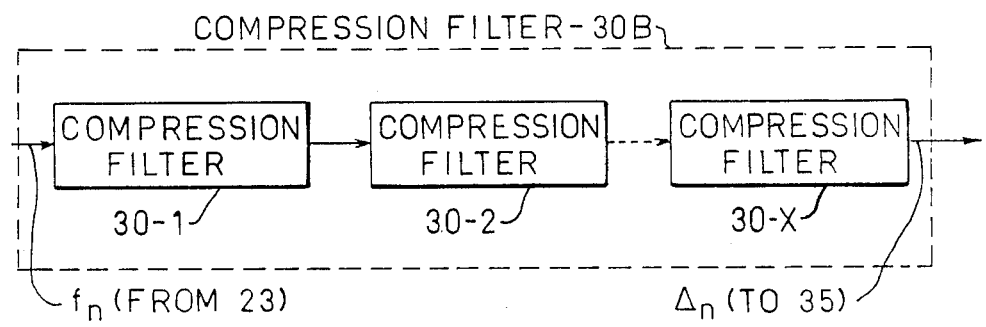
FIGS. 11A and 11B show cascade compression and reconstruction filter elements which provide for construction and reconstruction filters with any desired number of zeros and poles, respectively.
Figure 11B:
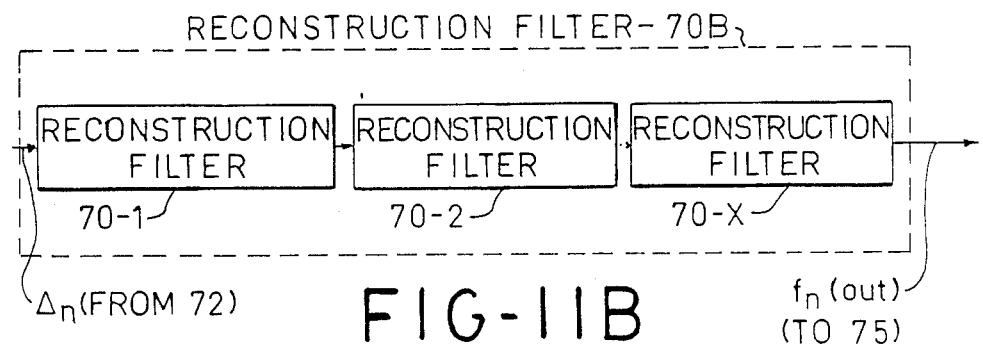

As is well under stood in this art, filters may be connected in cascade whereby the resultant filter has zeros and poles at locations provided by each of the filter elements, or sections. The cascade connection of filter elements is illustrated in FIGS. 11A and 11B wherein compression and reconstruction filters, respectively, are shown. Compression filter 30B shown in FIG. 11A comprises cascade compression filter elements 30-1 through 30-x, and reconstruction filter 70B shown in FIG. 11B comprise cascade reconstruction filter element 70-1, through 70-x.

For example only, and not by way of limitation, to provide compression filter 30B with two zeros at 0° and a pair of complex zeros at ±60°, two filter sections 30-1 and 30-2 may be employed which sections implement compression filter difference equations (5) and (19) respectively. No additional filter sections are required for compression filtering with these zero locations. A corresponding reconstruction filter 70B that employs two filter sections 70-1 and 70-2 may be employed, which sections implement reconstruction filter difference equations (7) and (8), and (21), respectively, to provide the filter with two poles at 0° and a pair of complex poles at ±60°.

Figure 12:
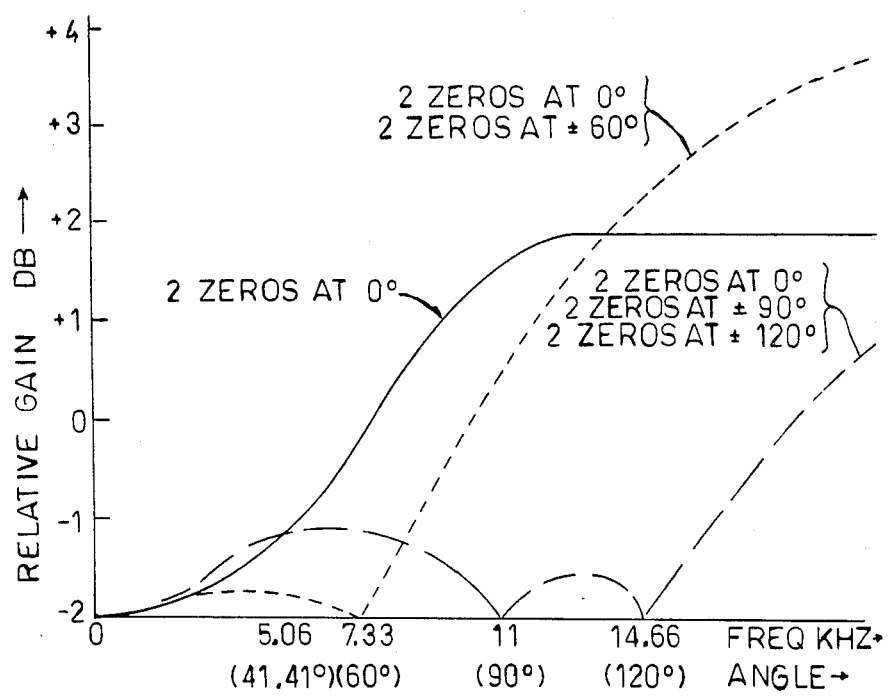
FIG. 12 is a graph showing the frequency response of three different compression filters having zeros on the unit circle of the Z-transform at some of the positions identified in FIG. 5.

Similarly, a compression filter having two zeros at 0°, a pair of complex zeros at ±90° and a pair of complex zeros at ±120° may be implemented by use of a three-section filter 30B which sections implement compression filter equations (5), (16), and (22), respectively. A corresponding reconstruction filter 70B that employs three filter sections may be employed, which sections implement reconstruction filter difference equations (7) and (8), (18), and (24) to provide the filter with two poles at 0°, a pair of complex poles at ±90° and a pair of complex poles at ±120°. In FIG. 12, the frequency response of three different compression filters is shown which filters have zeros on the unit circle in the Z-plane at 0°; 0° and ±60°; and 0°, ±90° and ±120°.

SYSTEM WITH ANGULARLY MOVABLE ZEROS AND POLES

The invention is not limited to use with compression and reconstruction filters having zeros and poles at fixed angular locations. For example, the system may include means for, essentially, analyzing the frequency spectrum of successive segments of the audio frequency input signal. Then, based upon the spectrum, the compression filter zeros are selected to minimize the entropy of that segment. For each segment, a signal indicative of the zero positions of the compression filter is produced which signal is transmitted to the receiver along with the compressed and encoded signals. At the receiver, the signal indicative of the zero positions of the compression filter is employed to provide the reconstruction filter with poles at corresponding angular positions. Each segment may include, for example, 128 digital sample signals such that a single signal indicative of the compression filter zero positions is transmitted for every 128 compressed and encoded sample signals. With this arrangement, it will be apparent that the angular positions of the zeros and poles of the compression and reconstruction filters may change with time dependent upon the frequency spectrum of the audio signal input. In all cases the positive angular positions of the zeros and poles are limited to the above identified angles of 0°, 41.41°, 60°, 75.52°, 90°, 104.48°, 120°, 138.59° and 180°.

Different means for implementing an adaptive filter system of the above-mentioned type wherein zeros and poles of the respective compression and reconstruction filters are restricted in operation to the above-identified angles will be apparent to those skilled in the art. One such means includes the use of a cascade of, say, four stages of second order compression filtering at the transmitting or recording unit, and a cascade of four second order reconstruction filters at the receiving or playback unit. There is, of course, no theoretical reason for limiting the filters to four stages. However, for many applications, such as music compression, the use of four stages generally is sufficient to enable selection of all useful filter element combinations.

Each stage of the compression filter is capable of operating with a pair of zeros on the unit circle, in its Z-plane transfer function, at anyone of the above-identified "frequencies", i.e. 0°, ±41.41°, ±60°, ±75.52°, ±90°, ±104.48°, ±120°, ±138.59° and 180°. The resulting filter is the cascade of the four stages (or fewer stages where all four stages are not required to minimize the bit count from the encoder 40). The transfer function of the compression filter is the product of the transfer functions of the individual stages employed.

Sample signals $f_n$ are supplied to the compression filter in blocks of, say, 128 samples, and the zeros of the filter stages are developed on a block-by-block basis by determining the best "frequency" (i.e. zeros) for each stage. The block of data is passed through the first filter stage operating at one of the nine permissible "frequencies" during which time the output from the stage is encoded and the encoder output bits are counted. This operation is repeated nine times, once for each of the permissible operating "frequencies", and the operating "frequency" that minimizes the encoded bit count is selected as the best 37 "frequency" for the first stage.

The process then is repeated for the second compression filter stage using the first stage output as the second stage input. This operation is continued for all four stages, or until further compression is impossible. Thus, it will be understood that the transmitter processes each block of input data nine times for each compression filter stage, or until no further compression is possible. In most practical cases there will be an optimum number of stages, say three, in which all of the nine possible "frequencies" for the fourth stage will actually cause an increase in the encoded bit count over that of the third stage. In this case, the block of samples from the the third stage is encoded and transmitted to the receiver.

The selected filter for the block of data is identified by a four digit number, with each digit (0 through 9) representing one of the permissible frequencies, and the digit 0 representing "no filter stage". Thus, a codeword of 1130 would represent a four-stage filter consisting of two zeros at dc, two more zeros at dc, and the two complex zeros (one complex pair) at 60°. The fourth stage would not be employed in the compression of this data block.

The four digit number is transmitted, or stored, along with each block of 128 encoded samples for use by the receiver. At the receiver the codeword is stripped from the blocks of encoded compressed sample signals. In the receiver the four-stage reconstruction filter is reconfigured to the new filter parameters at the block boundary. Reconfiguration requires only that the feedback coefficients of the reconstruction filter difference equations be modified at this instant which, in turn, only requires the filter to lookup the coefficients for a "1130" type filter in the present example. With a cascade connection of pole pairs at the reconstruction filter, the lookup table may comprise nine sets of three numerical coefficients each, one of each of the nine frequencies. Since the numerical coefficients for two of the terms of the reconstruction filter equations are constant, the lookup table simply may comprise nine numerical coefficients, one for each equation.

As is well known in optimization theory, sequential optimization of each individual stage such as described above rarely produces the overall optimum system. However, it produces better results than a single fixed filter.

Figure 13A:
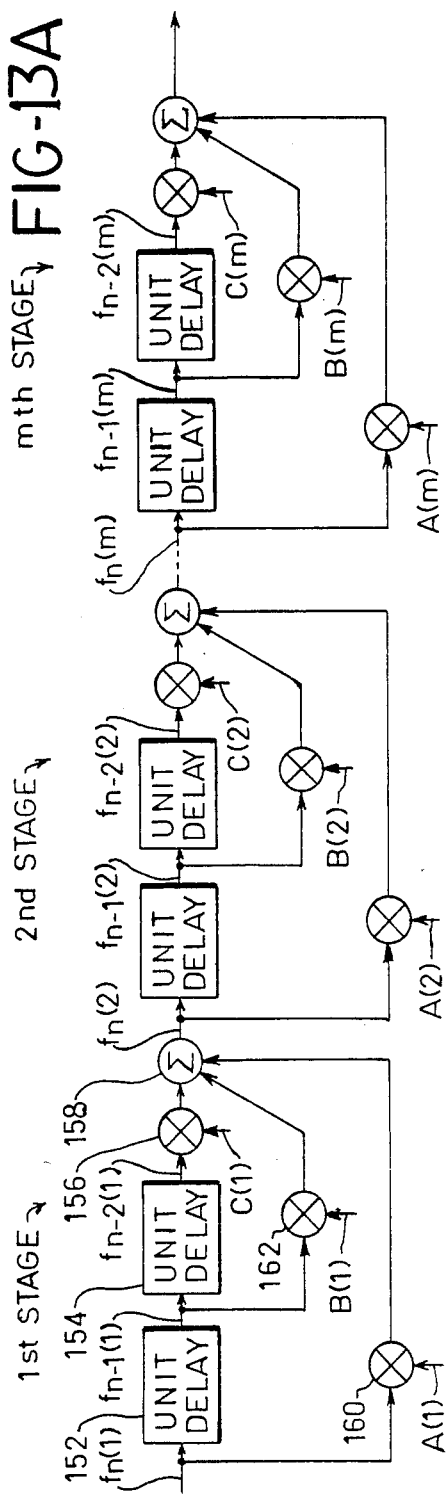
FIGS. 13A and 13B are block diagrams of adaptive compression and reconstruction filter means, respectively, for use in a system having angularly movable zeros and poles.

Reference now is made to FIG. 13A wherein an adaptive compression filter is shown, which filter may be used in place of compression filter 30 shown in FIG. 1A to provide for a system with angularly movable zeros. (In FIG. 13B, described herein below, a reconstruction filter is shown which may be used in place of reconstruction filter 70 of FIG. 1B for reconstruction filtering of compressed signals provided by the compression filter shown in FIG. 13A).

In FIG. 13A, an adaptive compression filter having "m" cascade-connected stages is shown. Each stage is of the second order and provides for a pair of zeros. All of the stages are of the same construction, and the 1st, 2nd and mth stages are shown. Since all of the stages include the same elements, a detailed description of only one stage is provided. The first stage is shown comprising first and second unit delays 152 and 154, multiplier 156, and summing unit 158 in series connection. The input $f_n(1)$ to the first stage is supplied to the first unit delay 152 and to the summing unit 158 through multiplier 160. It here will be noted that the numeral in parenthesis is associated with the stage number. The output from the first unit delay 152 is connected to the summing unit 158 through a multiplier 162. The multipliers 156, 160 and 162 are provided with second inputs C(1), A(1) and B(1), respectively, which provide the numerical coefficients of the selected compression filter equation. For convenience, reference is made to Table 2 showing the permissible Z-transforms and compression and reconstruction filter equations.

TABLE 2

| | | FORMULAS FOR CASCADE STAGES OF ZERO AND POLE PAIRS | | |
|---|---|---|---|---|
| θ | FREQUENCY | TRANSFER FUNCTION $G_Z =$ | COMPRESSION FILTER $\Delta_n =$ | RECONSTRUCTION FILTER $y_n =$ |
| 0 | dc | $1 - 2.0Z^{-1} + Z^{-2}$ | $f_n - 2.0f_{n-1} + f_{n-2}$ | $\Delta_n + 2.0y_{n-1} - y_{n-2}$ |
| 41.41 | | $1 - 1.5Z^{-1} + Z^{-2}$ | $f_n - 1.5f_{n-1} + f_{n-2}$ | $\Delta_n + 1.5y_{n-1} - y_{n-2}$ |
| 60 | Fs/6 | $1 - 1.0Z^{-1} + Z^{-2}$ | $f_n - 1.0f_{n-1} + f_{n-2}$ | $\Delta_n + 1.0y_{n-1} - y_{n-2}$ |
| 75.5 | | $1 - 0.5Z^{-1} + Z^{-2}$ | $f_n - 0.5f_{n-1} + f_{n-2}$ | $\Delta_n + 0.5y_{n-1} - y_{n-2}$ |
| 90 | Fs/4 | $1 + Z^{-2}$ | $f_n + f_{n-2}$ | $\Delta_n - y_{n-2}$ |
| 104.5 | | $1 + 0.5Z^{-1} + Z^{-2}$ | $f_n + 0.5f_{n-1} + f_{n-2}$ | $\Delta_n - 0.5y_{n-1} - y_{n-2}$ |
| 120 | 2Fs/3 | $1 + 1.0Z^{-1} + Z^{-2}$ | $f_n + 1.0f_{n-1} + f_{n-2}$ | $\Delta_n - 1.0y_{n-1} - y_{n-2}$ |
| 138.59 | | $1 + 1.5Z^{-1} + Z^{-2}$ | $f_n + 1.5f_{n-1} + f_{n-2}$ | $\Delta_n - 1.5y_{n-1} - y_{n-2}$ |
| 180 | Fs/2 | $1 + 2.0Z^{-1} + Z^{-2}$ | $f_n + 2.0f_{n-1} + f_{n-2}$ | $\Delta_n - 2.0y_{n-1} - y_{n-2}$ |

Fs = SAMPLING FREQUENCY
= θ × Fs/360

From the table, it will be seen that all of the $f_n$ and $f_{n-2}$ terms of the compression filter equations have numerical coefficients of one (+1) whereby the values of A(1) and C(1) are one (+1) at all times. The value of B(1) which provides the numerical coefficient for the $f_{n-1}$ term of the compression equation varies between minus two (−2) and plus two (+2) in steps of 0.5. As described above, the value of B(1) employed is selected to minimize the encoded bit count from encoder 40.

The output from the summing unit 158 comprises the input $f_n(2)$ to the second compression filter stage. The process of selecting the numerical coefficient B(2) for the second stage again involves testing each coefficient and selecting that value, from the allowable values, which minimizes the bit count from variable word length encoder 40. As described above, this process is repeated for each stage, or until no further compression is possible.

Figure 13B:
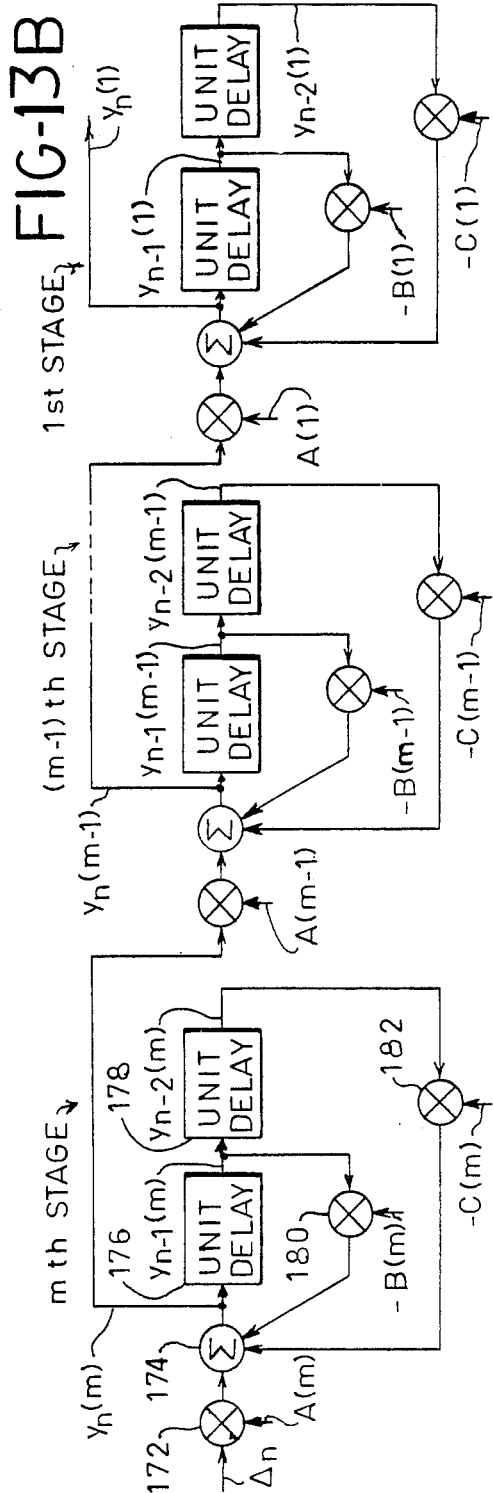

As noted above, a code word which identifies the selected combination of filter stages is transmitted to the receiver for use in establishing the numerical coefficients for the reconstruction filter. An adaptive reconstruction filter which may be employed in the present invention is shown in FIG. 13B, to which figure reference now is made. The reconstruction filter includes the same number of stages, m, as the compression filter, all of which stages are of the same construction. For purposes of illustration only, and not by way of limitation, poles of the reconstruction filter shown in FIG. 13B are located on the unit circle. As described above, the poles may be located inside the unit circle at any of the allowable angular positions.

The stream of difference signal values $\Delta_n$ from buffer memory 72 (FIG. 1B) is supplied as an input to the mth stage of the reconstruction filter. The mth stage, as all of the other stages, comprises a multiplier 172 to which the input signal $\Delta_n$ is supplied as one input and to which the numerical coefficient A(m) is supplied as a second input. As seen in Table 2, the numerical coefficient for the $\Delta_n$ terms of all of the reconstruction filter equations is plus 1(+1), so the value of the coefficient A for this and every other reconstruction filter stage remains fixed at +1.

The output from multiplier 172 is supplied as one input to a summing unit 174. The summing unit output is supplied to a first unit delay 176 and thence to a second unit delay 178. The output from the first unit delay 176 is fed back to summing unit 174 through multiplier 180, and the output from the second unit delay 178 is fed back to summing unit 174 through multiplier 182. The numeric coefficient −B(m) is supplied as a second input to multiplier 180, and the numeric coefficient −C(m) is supplied as a second input to multiplier 182. As seen in Table 2, the numeric coefficient for the $y_{n-2}$ term of all of the reconstruction filter equations is minus 1(−1), so the value of the coefficient C for this and every other reconstruction filter stage remains fixed at −1.

The output $y_{n-1}$ from the first unit delay is multiplied by the numerical coefficient −B(1) which varies between minus two (−2) and plus two (+2) in steps of 0.5. The code word supplied to the receiver establishes which numerical coefficient is employed at each stage of the reconstruction filter. As seen from Table 2, the coefficient for the $y_{n-1}$ term for the mth stage of the reconstruction filter is the same as that for the $f_{n-1}$ term of the mth stage of the compression filter, except that the sign thereof is reversed.

The output $y_n(m)$ from the mth stage of the reconstruction filter is fed over line 184 to the input to the m−1th stage. The final stage in the cascade connection of stages, identified as the 1st stage, has an output $y_n(1)$ which is supplied to the high frequency emphasis filter 75 of FIG. 1B.

Figure 14A:
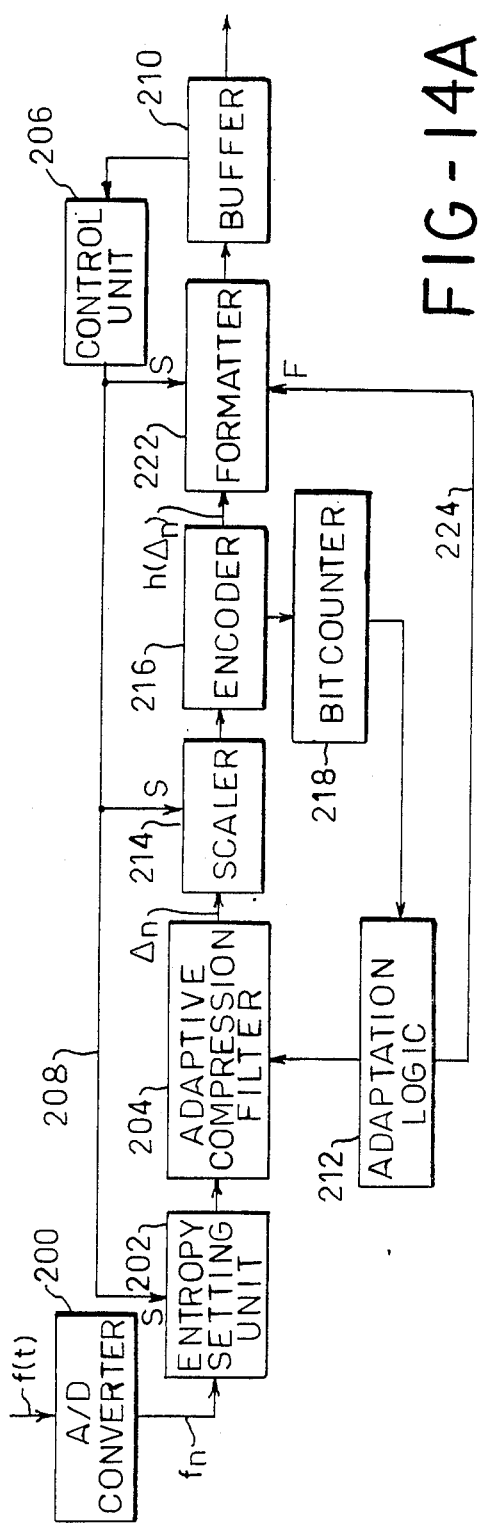
FIGS. 14A and 14B show a transmitter and receiver, respectively, of a data reduction system in which the adaptive compression and reconstruction filters of FIGS. 13A and 13B may be used.
Figure 14B:
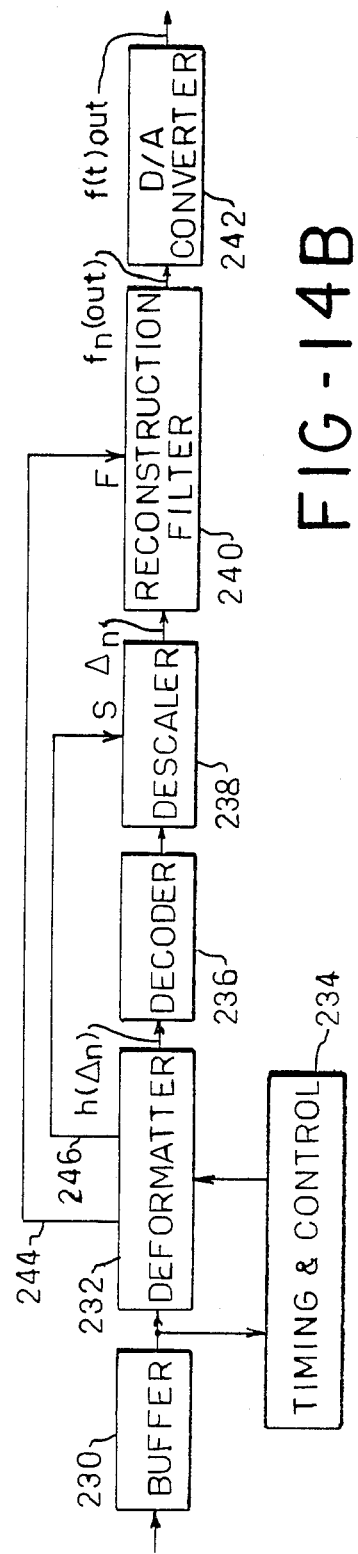

Reference now is made to FIGS. 14A and 14B which together show a block diagram of a data reduction system employing adaptive compression and reconstruction filters; a transmitter being shown in FIG. 14A, and a receiver being shown in FIG. 14B. The transmitter of FIG. 14A comprises an analog to digital converter 200 to which an analog input signal f(t) is supplied. The digital sample signal stream, $f_n$, from converter 200 is supplied in blocks of, say, 128 samples, to an entropy setting unit 202 which controls the entropy of signals supplied to an adaptive digital compression filter 204. At the entropy setting unit 202, one or more of the least significant bits of the sample signals may be set to a predetermined value, i.e. to 1 to 0, under control of the output from a control unit 206 supplied thereto over line 208. Control unit 206, in turn, is responsive to the difference in the number of bits written into a buffer memory 210 at the transmitter output and the number read out therefrom.

Entropy setting unit 202 operates by truncation, roundoff, or the like, of the sample signals from converter 200. If the buffer memory 210 is nearly empty, the sample signals pass unaltered through the entropy setting unit 202. As the buffer memory fills, one least significant is set to a predetermined value, and as filling of the buffer memory increases, additional least significant bits are set to predetermined values. In this manner, the effective, not actual, word length of the sample signals from the analog to digital converter 200 is controlled as a function of the number of bits contained in buffer memory 210. Overflow of buffer memory 210 thereby is avoided.

Operation of adaptive compression filter 204 is under control of an adaptation logic circuit 212. The filter output $\Delta_n$ is supplied to a scaler 214 which is provided with a control signal from control unit 206. Scaler 214, comprising e.g. a shift register, provides means for shifting the signal output, $\Delta_n$, from the adaptive compression filter 204 to the right by an amount dependent upon the control signal from control unit 206. As with the entropy setting unit 202, resetting of the scaler takes place only at block boundaries. If buffer memory 210 is nearly empty, the compression filter output $\Delta_n$ is passed unaltered through the scaler to a variable word length encoder 216. As the buffer memory fills, the difference signal $\Delta_n$ is shifted one place to the right at scaler 214, and as filling of buffer memory increases, the amount of shifting increases. The number of bits that the difference signal $\Delta_n$ is right-shifted at scaler 214 may simply equal the number of least significant bits which are set to a predetermined value at entropy setting unit 202.

The adaptive compression filter 204 may be of the same type as shown in FIG. 13A and described above. An encoder 216 output is supplied to a bit counter 218, and the bit count output from counter 218 is supplied to the adaptation logic circuit 212 over line 220. As described above, a block of sample signals is passed through the first filter stage operating at one of the nine permissible "frequencies" during which time the encoder output bits are counted by counter 218 and the bit count is stored in adaptation logic circuit 212. The "frequency" of the first stage is changed under control of adaptation logic circuit 212, the block of data is again passed through the first filter stage, and the encoder output bits are again counted. This operation is repeated once for each of the permissible operating "frequencies". The adaptation logic circuit 212 identifies the operating "frequency" that minimizes the encoded bit count. The first stage then is set to operate at that "frequency".

Now, under control of adaptation logic 212, the block of data is passed through the first and second cascade-connected filter stages, the encoder output is again counted, and the count is momentarily stored in adaptation logic circuit 212. Again, the process is repeated for each of the allowable "frequencies", and the "frequency" which minimizes the encoded bit count is selected as the best "frequency" for the second stage. This operation is repeated for each filter stage, or until no further compression is possible. With the filter stages set to provide for a minimum bit count from encoder 216, the block of encoded data is transmitted from the encoder to formatter 222.

Adaptation logic circuit 212 generates the above-described code word which identifies the "frequency" setting for each of the compression filter stages, which code word is sent over line 224 to formatter 222. Another input to formatter 222 is obtained from control unit 206 which identifies the amount of round-off, or truncation, performed by entropy setting unit 202 and the amount of right-shifting performed by scaler 214. This information is included in headers for the data blocks supplied to the formatter 222 from encoder 216. The formatter output is supplied to buffer memory 210 for subsequent transmission to the input of the receiver shown in FIG. 14B.

Referring to FIG. 14B, the receiver includes a buffer memory 230 which is supplied with the output from buffer memory 210. The output from buffer memory 230 is supplied to a deformatting unit 232 and to a timing and control unit 234. The deformatter 232 includes means for stripping the headers from the data blocks. The encoded signals $h(\Delta_n)$ are supplied to a digital decoder 236 for decoding the same, and the decoded signals are supplied to a reconstruction filter 240 through descaler 238 having output $\Delta_n$. The reconstruction filter output $f_n(out)$ is converted to analog form $f(t)out$ at analog to digital converter 242.

The code word which identifies the compression filter settings, which is stripped from the data stream by deformatter 232, is supplied over line 244 to the reconstruction filter 240 where it is used to locate the poles of the reconstruction filter stages at the same angular positions as the zeros of the compression filter. As described above, a lookup table containing the allowable numerical coefficients of the reconstruction filter equations may be employed for use in establishing the proper pole positions. The word which identifies the scaling provided by scaler 214, which also is stripped from the data stream by deformatter 232, is supplied over line 246 to descaler 238. At descaler 238 the decoded signals are left-shifted by the same amount that they were right-shifted at scaler 214.

Changes in the adaptive filter system shown in FIGS. 14A and 14B will be apparent to those skilled in this art. For example, instead of selecting compression filter zero positions on the basis of a minimum encoder bit count, the $\Delta_n$ output from the compression filter may be checked, and the filter zero positions which provide for $\Delta_n$ a minimum size, or for the minimum mean square of $\Delta_n$, may be selected. Also, other means for implementing adaptive compression and reconstruction filtering may be employed. For example, a small bank of fixed filters may be provided, which operate at different allowable frequencies. Those fixed filters which substantially minimize entropy of the signal may be selected. Alternatively, if a tapped delay line filter were adjusted using the Widrow-Hoff algorithm to be a minimum mean square error one step predictor, then the filter constructed with zeros on the unit circle at the allowable positions that has the closest impulse response to the minimum mean square error one step predictor will be the minimum entropy compression filter.

Obviously, the invention is not limited to use with either fixed filter systems, or with adaptive filters which operate in the above-described manner. Other means for implementing adaptive filtering are well within the capabilities of one skilled in this art.

The invention having been described in detail in accordance with requirements of the Patent Statutes, various other changes and modifications will suggest themselves to those skilled in this art. For example, many of the illustrated functions may be implemented using a digital computer with suitable computer routines. Also, it will be apparent that the signal compression system need not include compression and reconstruction filters operable at all nine of the permissible "frequencies". For example, the allowable "frequencies" may be limited to, say, 0°, ±41.41°, ±60°, ±90°, ±120° and 180°. It is intended that this and other such changes and modifications shall fall within the spirit and scope of the invention defined in the appended claims.

I claim:

1. A signal compression system for processing a stream of fixed length digital sample signals comprising,
    linear digital compression filter means responsive to the stream of digital sample signals for generating a stream of compression-filtered sample signals, the Z-transform of the digital compression filter means having one or more zeros on the unit circle at one or more of the following angular positions; 41.41°, 60°, 75.52°, 90°, 104.48°, 120°, 138.59° and 180°, and not having zeros at any positive angular positions other than 0°, 41.41°, 60°, 75.52°, 90°, 104.48°, 120°, 138.59° and 180°.

2. A signal compression system as defined in claim 1 wherein said digital compression filter means performs arithmetic operations without truncation or roundoff.

3. A signal compression system as defined in claim 1 wherein said digital compression filter means is of the adaptive type, and including
    means for separating the stream of sample signals into successive blocks of sample signals, and
    means for controlling the angular positions of the zeros of the Z-transform of said digital compression filter means for each successive block of sample signals.

4. A signal compression system as defined in claim 1 including,
    linear digital reconstruction filter means, and
    means for transferring the output from said digital compression filter means to said digital reconstruction filter means for reconstruction filtering of the output therefrom, the Z-transform of the digital reconstruction filter means having poles on or inside the unit circle at the same angular positions as the zeros of the digital compression filter means.

5. A signal compression system as defined in claim 4 wherein said digital reconstruction filter means performs arithmetic operations with truncation for production of truncation errors in the output thereof.

6. A signal compression system as defined in claim 5 wherein said digital compression system performs arithmetic operation without truncation or roundoff.

7. A signal compression system as defined in claim 6 wherein the digital reconstruction filter poles are inside the unit circle.

8. A signal compression system as defined in claim 4 wherein said transferring means includes,
digital encoding means responsive to the stream of signals from the digital compression filter means and implementing a variable word length code,
digital decoding means,
means for transferring the output from said digital encoding means to said digital decoding means, said digital reconstruction filter means being responsive to the output from said digital decoding means.

9. A signal compression system as defined in claim 8 wherein said digital compression filter means and digital reconstruction filter means are of the adaptive type.

10. A signal compression system as defined in claim 9 including,
means for separating the stream of sample signals into successive blocks of sample signals which are supplied to said digital compression filter means, and
means for controlling the angular positions of the zeros of the Z-transform of the digital compression filter means to substantially minimize the entropy of blocks of encoded compression-filtered sample signals from said digital encoding means.

11. A signal compression system as defined in claim 10 including,
means for generating a code word for each block of encoded compressed sample signals to identify the angular positions of the zeros of the Z-transform of the digital compression filter means used to minimize the entropy of said blocks of encoded compression-filtered sample signals, and
means for transferring said code words to said digital reconstruction filter means for controlling the angular positions of the poles of the Z-transform of said digital reconstruction filter means.

12. A signal compression system as defined in claim 8 wherein said digital compression filter means comprises a plurality of compression filter stages each of which stages operates with a pair of zeros in its Z-plane transfer function, and
said digital reconstruction filter means comprises a plurality of reconstruction filter stages each of which stages operates with a pair of poles in its Z-plane transfer function.

13. A signal compression system as defined in claim 4 including
analog to digital converting means from which digital sample signals are obtained by analog to digital conversion of analog signals, and
digital to analog converting means for converting digital output signals from said digital reconstruction filter means to analog form.

14. A signal compression system as defined in claim 13 wherein digital sample signals are obtained from said analog to digital converting means at a rate of between 30 to 50 Khz.

15. A system for compressing audio data in the form of a stream of fixed length digital sample signals comprising,
means for forming the stream of sample signals into equal length data blocks,
adaptive digital compression filter means responsive to the blocks of sample signals for generating a stream of compression-filtered sample signals, the transfer function of said compression filter means having zeros on the unit circle in the Z-plane,
digital encoding means responsive to the stream of compression-filtered sample signals from the digital compression filter means and implementing a variable word length code, the output from the digital encoding means comprising blocks of encoded compression-filtered sample signals,
means for adjusting the angular positions of the zeros of the transfer function in the Z-plane of the digital compression filter means for each block of sample signals supplied thereto to substantially minimize the entropy of the blocks of encoded compressed sample signals from said digital encoding means, the positive angular positions to which said zeros may be adjusted by said adjusting means being restricted to 0°, 41.41°, 60°, 75.52°, 90°, 108°48', 120°, 138.59° and 180°, and
means for inserting an identifying code word with each block of encoded compressed sample signals from the digital encoding means for identifying the angular positions of the zeros of the transfer function of the digital compression filter means employed to substantially minimize the entropy of the blocks of encoded compression-filtered sample signals.

16. A system as defined in claim 15 including
means for stripping the identifying code word from the blocks of encoded compression-filtered sample signals,
digital decoder means responsive to the blocks of encoded compression-filtered sample signals for decoding the same,
adaptive digital reconstruction filter means responsive to the blocks of decoded signals from said digital decoder means, the transfer function of said reconstruction filter means having poles on or inside the unit circle in the Z-plane, and
means responsive to the code word from said stripping means for selecting the angular positions of the poles of the transfer function in the Z-plane of the digital reconstruction filter means so as to correspond to the angular positions of the zeros of the digital compression filter means.

17. In a method of filtering a stream of fixed length digital sample signals, the steps comprising,
supplying the stream of sample signals to a linear digital compression filter means,
operating the digital compression filter means with a transfer function in the Z-plane having one or more zeros on the unit circle at one or more of the following angular positions as measured form the origin as follows: 41.41°, 60°, 75.52°, 90°, 104.48°, 120°, 138.59°, and 180°,
restricting operation of the digital compression filter means so that it does not operate with zeros at any positive angular position other than at 0°, 41.41°, 60°, 75.52°, 90°, 104.48°, 120°, 138.59° and 180°.

18. In a method of filtering as defined in claim 17 including,
transferring the output from the digital compression filter means to a linear digital reconstruction filter means,
operating the digital reconstruction filter means with a transfer function in the Z-plane with poles on or inside the unit circle at the same angular positions as the zeros of the digital compression filter means.

19. In a method of filtering as defined in claim 17 including,
operating the digital compression filter means without truncation or roundoff.

20. In a method of filtering as defined in claim 18 including,
operating the digital compression filter means without truncation or roundoff, and
operating the digital reconstruction filter means with truncation or roundoff.

21. In a method as defined in claim 18 wherein the step of transferring the output from the digital compression filter means to the digital reconstruction filter means includes encoding the output from the digital compression filter means using a variable word length code to produce an encoded signal stream, and decoding the encoded signal stream.

22. In a method as defined in claim 21 including controlling the angular positions of the zeros of the digital compression filter means to substantially minimize the bit count of the encoded signal stream for successive blocks of the sample signal stream.

23. In a method of filtering audio data which is in the form of a stream of fixed length digital sample signals, the steps comprising
compression filtering successive blocks of sample signals by adaptive compression filter means having zeros on the unit circle in the Z-plane,
encoding the successive blocks of compression filter sample signals from the compression filter means using an encoder which implements a variable word length code,
controlling the angular positions of the zeros of the transfer function in the Z-plane of the compression filter means to substantially minimize the entropy of the successive blocks of signals from the encoder,
restricting operation of the compression filter means to provide for zeros in the Z-plane transfer function thereof at only one or more of the angular positions of 0°, ±41.41°, ±60°, ±75.52°, ±90°, ±108.48°, ±120°, ±138.59°, and 180°.

* * * * *